(12) United States Patent
Kim et al.

(10) Patent No.: US 9,450,169 B2
(45) Date of Patent: Sep. 20, 2016

(54) OMNI-DIRECTIONAL SHEAR-HORIZONTAL WAVE MAGNETOSTRICTIVE PATCH TRANSDUCER AND METHOD OF WINDING COIL

(71) Applicant: SNU R&DB FOUNDATION, Seoul (KR)

(72) Inventors: Yoon Young Kim, Seoul (KR); Hong Min Seung, Seoul (KR); Hoe Woong Kim, Seoul (KR)

(73) Assignee: SNU R&DB Foundation, Seoul (KR)

( * ) Notice: Subject to any disclaimer, the term of this patent is extended or adjusted under 35 U.S.C. 154(b) by 610 days.

(21) Appl. No.: 13/953,633

(22) Filed: Jul. 29, 2013

(65) Prior Publication Data

US 2014/0354388 A1 Dec. 4, 2014

(30) Foreign Application Priority Data

May 29, 2013 (KR) ........................ 10-2013-0060786

(51) Int. Cl.
*H01F 38/00* (2006.01)
*H01L 41/12* (2006.01)
*B06B 1/08* (2006.01)

(52) U.S. Cl.
CPC ............. *H01L 41/12* (2013.01); *B06B 1/08* (2013.01); *Y10T 29/49071* (2015.01)

(58) Field of Classification Search
CPC ....... H01L 41/12; B06B 1/08; B06B 1/0261; H01F 41/10; H02P 25/027; H02N 2/14
USPC ........ 310/26, 300; 29/605; 324/207.13, 654; 331/157; 318/114, 118
See application file for complete search history.

(56) References Cited

U.S. PATENT DOCUMENTS 8,912,704 B2 * 12/2014 Petter .................... H02K 21/16
290/44

(Continued)

FOREIGN PATENT DOCUMENTS

KR          10-0677920 B1      2/2007
KR     10-2010-0108846         10/2010

(Continued)

OTHER PUBLICATIONS

KIPO Notice of Allowance dated Sep. 25, 2014, with English translation, corresponding to Korean priority Patent application 10-2013-0060786, (3 pages).
KIPO Office action dated Jul. 17, 2014, with English translation, for Korean priority Patent application 10-2013-0060786, (13 pages).
Seung, H. M., et al. *Development of an omni-directional shear-horizontal wave magnetostrictive patch transducer for plates*, SciVerse ScienceDirect: Ultrasonics, vol. 53, (2013), pp. 1304-1308.

*Primary Examiner* — Shawki S Ismail
*Assistant Examiner* — Bryan Gordon
(74) *Attorney, Agent, or Firm* — Lewis Roca Rothgerber Christie LLP

(57) ABSTRACT

Provided is a transducer. The transducer includes a permanent magnet that generates a magnetostatic field, a patch disposed below the permanent magnet and formed of a material that deforms according to a magnetic field, an insulator disposed on a top surface of the patch, and a coil wound around the patch and the insulator in a certain form and allowing a magnetomotive field to be induced on the patch according to an applied current. The wound coil has a form in which directions of the magnetostatic field generated by the permanent magnet and the magnetomotive field generated by winding the coil are orthogonal to each other.

13 Claims, 12 Drawing Sheets

(56) References Cited

U.S. PATENT DOCUMENTS

| | | | |
|---|---|---|---|
| 2009/0038315 A1* | 2/2009 | Johnson | H01M 14/00 60/783 |
| 2010/0132480 A1* | 6/2010 | Bitto | G01F 1/8418 73/861.357 |
| 2010/0244591 A1* | 9/2010 | Cho | H01L 41/125 310/26 |
| 2010/0321009 A1* | 12/2010 | Lee | G01M 5/0033 324/209 |

FOREIGN PATENT DOCUMENTS

| | | |
|---|---|---|
| KR | 10-2010-0137770 | 12/2010 |
| KR | 10-1061590 | 8/2011 |

* cited by examiner

OMNI-DIRECTIONAL SHEAR-HORIZONTAL WAVE MAGNETOSTRICTIVE PATCH TRANSDUCER AND METHOD OF WINDING COIL

CROSS-REFERENCE TO RELATED PATENT APPLICATION

This application claims priority to and the benefit of Korean Patent Application No. 10-2013-0060786, filed on May 29, 2013, in the Korean Intellectual Property Office, the disclosure of which is incorporated herein in its entirety by reference.

BACKGROUND OF THE INVENTION

1. Field of the Invention

The present invention relates to a transducer, and more particularly, to a transducer including a permanent magnet that generates a magnetostatic field, a patch disposed below the permanent magnet and formed of a material that deforms according to a variation in a magnetic field, an insulator disposed on a top surface of the patch, and a coil wound on the patch and the insulator in a certain form and inducing a magnetomotive field on the patch according to an applied current, in which the form of winding the coil is configured to be a form by which directions of the magnetostatic field generated by the permanent magnet and the magnetomotive field generated by winding the coil are orthogonal to each other.

2. Description of the Related Art

Magnetostriction, also referred to as the Joule effect, is a phenomenon in which a mechanical strain occurs when a ferromagnetic material is located under a magnetic field. As an inverse phenomenon thereof, a phenomenon, in which a magnetic state of the inside of a material varies when a stress acts on the material, is referred to as an inverse magnetostrictive effect or a Villari effect.

Since transducers using a magnetostriction effect may measure a deformation of an object with on mechanical contact with the object, the transducers have been used in several fields in which it is impossible to apply contact-type sensors. When using the magnetostriction effect, it is possible not only to generate elastic waves with no contact but also to generate elastic waves having larger magnitudes than those of methods using a typical piezoelectric effect.

Since omni-directional transducers may generate waves having the same magnitude and mode in all directions, when applying omni-directional transducers to phased array systems, it is possible to efficiently focus waves by using the same algorithm with respect to all directions. However, typical omni-directional transducers generally generate and measure Lamb waves, which have several limitations in comparison with shear-horizontal waves, fundamental mode (SH0 mode) of which has non-dispersive property. Accordingly, it is necessary to develop magnetostrictive patch transducers capable of efficiently generating and measuring shear-horizontal waves.

CITED REFERENCE

Korean Patent Registration No. 10-1061590

SUMMARY OF THE INVENTION

The present invention provides a transducer, and more particularly, to a transducer including a permanent magnet that generates a magnetostatic field, a patch disposed below the permanent magnet and formed of a material that deforms according to a variation in a magnetic field, an insulator disposed on a top surface of the patch, and a coil wound on the patch and the insulator in a certain form and inducing a magnetomotive field on the patch according to an applied current, in which the form of winding the coil is configured to be a form by which directions of the magnetostatic field generated by the permanent magnet and the magnetomotive field generated by winding the coil are orthogonal to each other.

According to an aspect of the present invention, there is provided a transducer including a permanent magnet generating a magnetostatic field, a patch disposed below the permanent magnet and formed of a material deformed according to a magnetic field, an insulator disposed on a top surface of the patch, and a coil wound around the patch and the insulator as a certain form and allowing a magnetomotive field to be induced to the patch according to an applied current. The wound coil has a form in which directions of the magnetostatic field generated by the permanent magnet and the magnetomotive field generated by winding the coil are orthogonal to each other.

The patch may include nickel.

The patch may be formed as a circular ring shape having a hole formed in the center thereof.

The permanent magnet may be disposed in a central portion of the patch in such a way that the magnetostatic field generated by the permanent magnet has a radial shape with the center of the patch as the center, and the coil may be wound to radially surround the circular ring-shaped patch in such a way that the magnetomotive field generated by the coil is formed in a circumferential direction along the patch.

The coil may be wound around the patch to be equally spaced from a circumferential direction of the patch.

The hole of the patch may have a radius that is ⅓ of the outer radius of the patch.

The insulator may be formed in a circular ring shape having a hole in the center thereof and may include outer grooves formed equally spaced on an outer circumferential part and inner grooves formed equally spaced on an inner circumferential part. The outer grooves and the inner grooves may be formed in the same number and are arranged in locations corresponding to one another in a diametrical direction.

The coil may be wound to surround the insulator while being disposed in and supported by the outer grooves and the inner grooves.

According to another aspect of the present invention, there is provided a coil-winding method of forming an equally-spaced coil by winding a wire around a patch type structure formed as a discus shape having a hole in the center thereof and including outer grooves formed equally spaced in an outer circumferential part and inner grooves formed equally spaced in an inner circumferential part, the outer grooves and the inner grooves being formed in the same number and being arranged in locations corresponding to one another in a diametrical direction. The method includes transferring the wire from the outside of the insulator along a top surface in a diametrical direction, winding the wire by transferring to a bottom surface of the patch through a first inner groove while transferring the wire to a first outer groove, transferring the wire exposed to the top surface through the first outer groove to a bottom surface through a top surface of a first guide and a second outer groove, and exposing the wire to the top surface through a bottom surface of a second guide and a third outer groove.

The method may further include, when forming an equally-spaced coil by winding a wire around a patch type structure having 2n (n≥1) number of outer grooves and inner grooves, respectively, winding the coil around the entire circumference once, allowing the coil to pass through a $2n^{th}$ outer groove $N_{2n}$ and to be exposed to a bottom surface, allowing the wire to pass bottom surfaces of a $2n^{th}$ outer guide and a first outer guide, exposing the wire to a top surface through the second outer groove $N_2$, and transferring the wire exposed to the top surface through the second outer groove $N_2$ to the second inner groove $M_2$.

According to still another aspect of the present invention, there is provided a transducer including an insulator and a patch around which a coil is wound by using the method as described above. The patch may be formed of a magnetostrictive material, and the patch may be disposed below the insulator.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
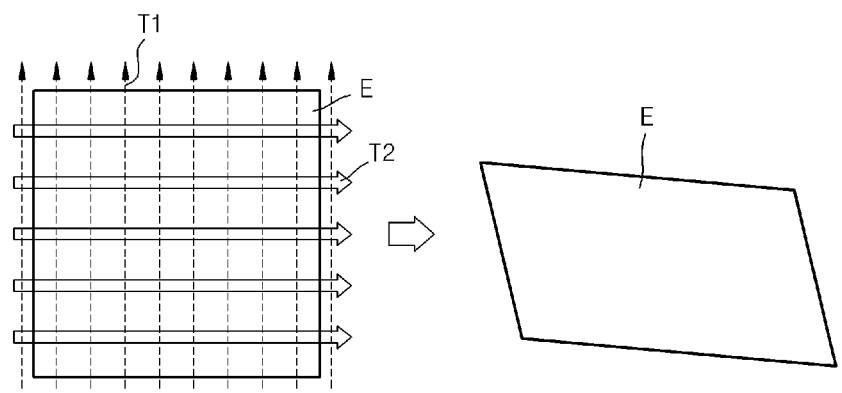
FIGS. 1 and 2 are conceptual views illustrating theories of a magnetostrictive phenomenon and an inverse magnetostrictive phenomenon with respect to shearing deformation.

As used herein, the term "and/or" includes any and all combinations of one or more of the associated listed items.

Hereinafter, exemplary embodiments of the present invention will be described in detail with reference to the attached drawings. The embodiments are not intended to be limitative.

Advantages, features, and a method of achieving the same will be specified with reference to embodiments that will be described in detail with reference to the attached drawings. However, the present invention will not be limited to the embodiments described below and may be embodied in various different forms. Merely, the exemplary embodiments are provided to perfectly disclose the present invention and to allow one of ordinary skill in the art to fully understand the present invention. The present invention is defined by the scope of claims thereof. Through the entire specification, like reference numerals designate like elements.

Expressions of "the left", "the right", and "the side", which are spatially relative, may be used to easily disclose correlations between one element or component and another element or component as shown in the drawings. The expressions spatially relative will be understood as terms including mutually different directions of an element when being used or operated, in addition to directions shown in the drawings. For example, when an element shown in the drawing overlies, "a vertical direction" may be understood as "a lateral direction". Accordingly, an exemplary term "vertical" may include "lateral". An element may be oriented a different direction in such a way that spatially relative terms may be understood according to an orientation thereof.

Additionally, the term "orthogonal" includes cases of being substantially orthogonal in addition to cases of being definitely orthogonal and will be understood as including a margin of error within a commonsensical range. Also, the term "omni-direction" will be understood as being substantially omni-directional and will not be understood as being limited to cases of being surely omni-directional.

Terms are used in the specification to describe the embodiments but not to limit the scope of the present invention. In the specification, a singular form includes a plural form if there is no particular mention. "Comprises" and/or "comprising" used in the specification do or does not exclude the existence or addition of one or more other elements, steps, operations, and/or devices in addition to an element, a step, an operation, and/or a device, which are mentioned.

If there is no other definition, all terms used in the specification, including technical and scientific terms, may be used as meanings capable of being understood to those skilled in the art in common. Also, terms defined in dictionaries generally used will not be ideally or excessively understood if not clearly and particularly defined.

In the drawings, thicknesses or sizes of respective elements are exaggerated, omitted, or schematically illustrated for convenience and clarity of description. Also, sizes and areas of respective elements do not completely reflect real sizes or real areas thereof.

Also, angles and directions mentioned while describing a structure in the embodiment are based on the drawings. In the specification, when not clearly mentioning a reference and relations of position with respect to an angle in a description on the structure, it is necessary to refer to a related drawing.

Figure 2:
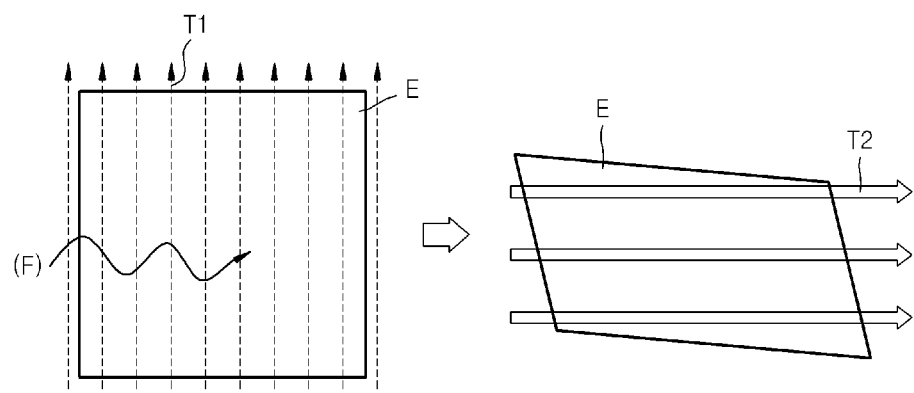

FIGS. 1 and 2 are conceptual views illustrating theories of a magnetostrictive phenomenon and an inverse magnetostrictive phenomenon with respect to shearing deformation. FIG. 1 illustrates a theory of actuating by a transducer 1 where according to an embodiment of the present invention. FIG. 2 illustrates a theory of sensing by the transducer 1.

That is, as shown in FIG. 1, when a magnetostatic field T1 having a certain direction is applied to an object E formed of a magnetostrictive material and a magnetomotive field T2 that is orthogonal to the magnetostatic field T1 is applied to the object E, a shearing deformation occurs in the magnetostrictive material due to a magnetic field variance.

On the other hand, as shown in FIG. 2, when the magnetostatic field T1 having the certain direction is applied to the object E formed of the magnetostrictive material and a shearing deformation F is applied to the object E, the magnetomotive field T2 that is orthogonal to the magnetostatic field T1 occurs.

In other words, when applying the magnetomotive field T2 to the magnetostrictive material to which the magnetostatic field T1 is applied, in a direction that is orthogonal to the magnetostatic field T1, the shearing deformation may occur and operate as an actuator. On the contrary, when applying the shearing deformation, that is, a shear-horizontal wave to the magnetostrictive material to which the magnetostatic field T1 is applied, the magnetomotive field T2 may occur due to an induced electromotive force corresponding thereto and may operate as a measurement device. Accordingly, it is possible to use a device having one configuration as an actuator and a sensor by choice at the same time.

Figure 3:
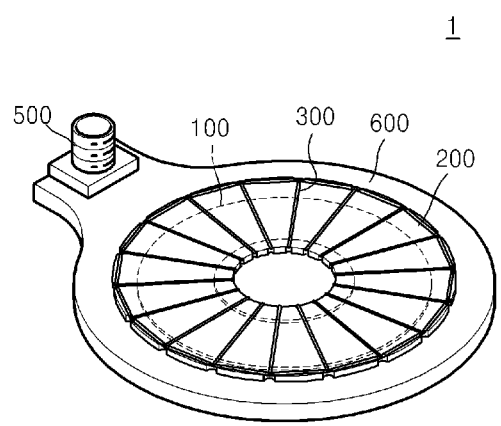
FIGS. 3 and 4 are views illustrating a transducer according to an embodiment of the present invention.
Figure 4:
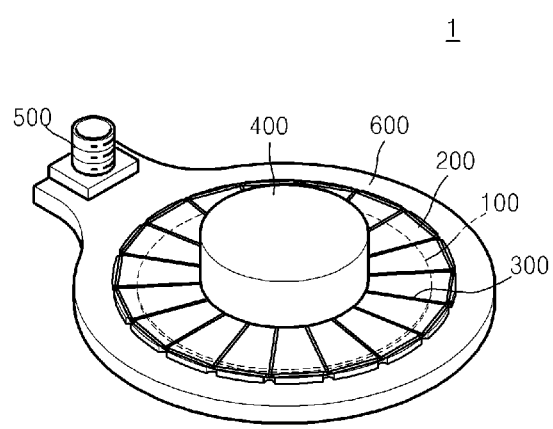
Figure 5:
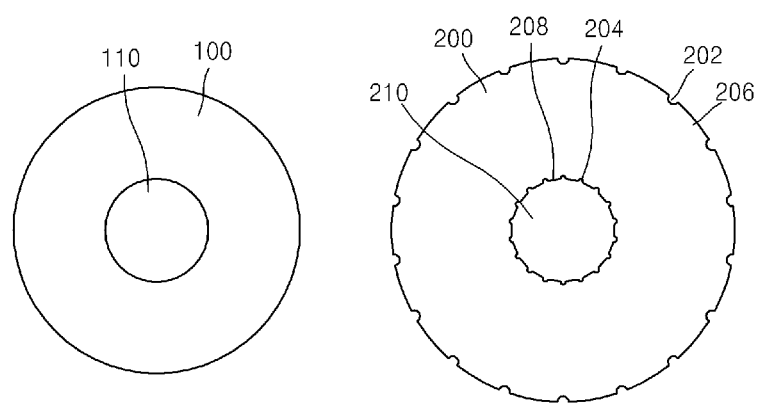
FIG. 5 is a view illustrating a patch and an insulator of the transducer of FIG. 3.
Figure 6:
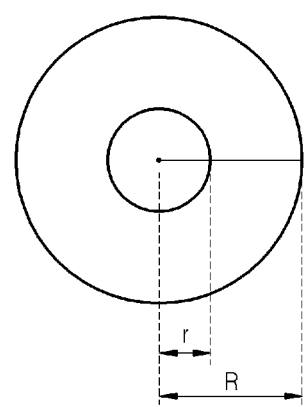
FIG. 6 is a view illustrating the patch of FIG. 5.
Figure 7:
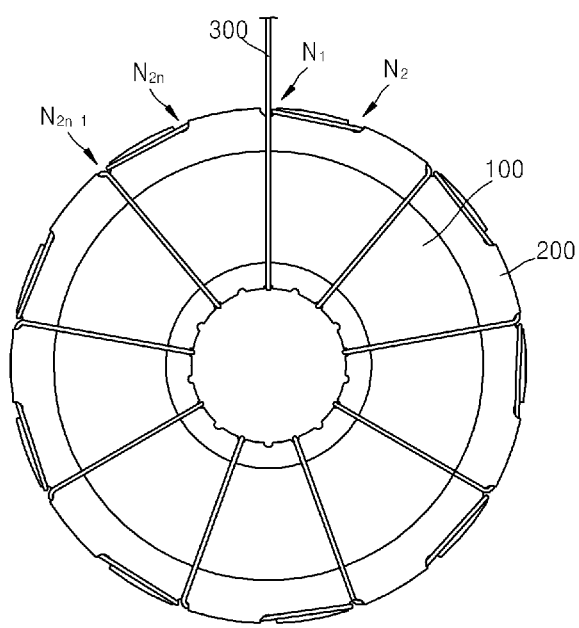
FIGS. 7 to 9 are views illustrating states of winding coils around the patch and the insulator of the transducer of FIG. 3.
Figure 8:
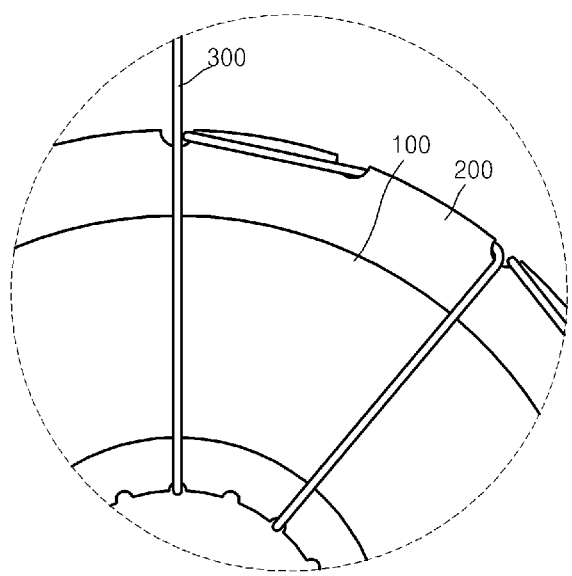
Figure 9:
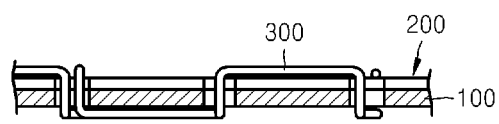
Figure 14:
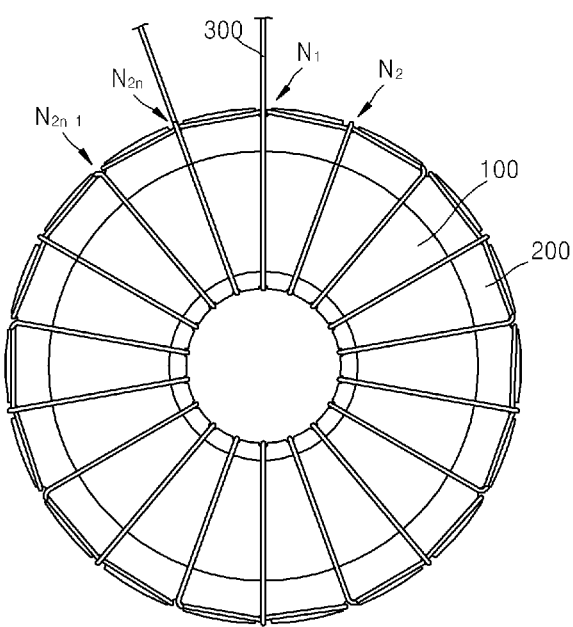
FIG. 14 is a view illustrating the transducer around which coils are wound according to the method of winding the coils around the patch and the insulator of the transducer.
Figure 15:
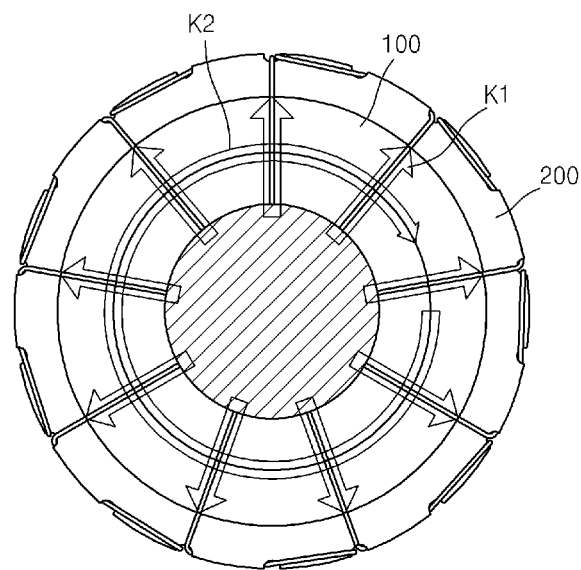
FIG. 15 is a view illustrating a magnetic field form of the transducer of FIG. 3.
Figure 15:
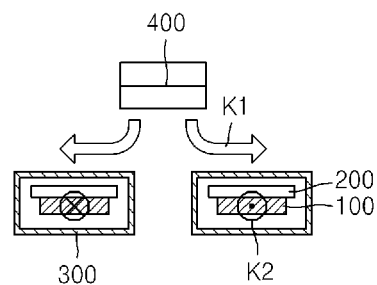

FIGS. 3 and 4 are views illustrating the transducer 1 according to embodiments of the present invention. FIG. 5 is a view illustrating a patch 100 and an insulator 200 of the transducer 1. FIG. 6 is a view illustrating the patch 100. FIGS. 7 to 9 are views illustrating states of winding coils around the patch 100 and the insulator 200 of the transducer 1. FIGS. 10 to 13 are views illustrating a method of winding coils around the patch 100 and the insulator 200 of the transducer 1. FIG. 14 is a view illustrating the transducer 1, around which coils are wound according to the method of winding coils around the patch 100 and the insulator 200 of the transducer 1. FIG. 15 is a view illustrating a magnetic field form of the transducer 1.

Referring to FIGS. 3 and 4, the transducer 1 includes a permanent magnet 400 generating a magnetostatic field, the patch 100 disposed below the permanent magnet 400 and formed of a material that deforms according to a variation in a magnetic field, the insulator 200 disposed on a top surface of the patch 100, and a coil 300 wound on the patch 100 and the insulator 200 in a certain form and inducing a magnetomotive field on the patch 100 according to an applied current, in which the form of winding the coil 300 may be configured to be a form by which directions of the magnetostatic field generated by the permanent magnet 400 and the magnetomotive field generated by the coil 300 are orthogonal to each other.

The permanent magnet 400 is provided to generate a magnetostatic field.

The patch 100 is formed of the material that deforms according to a variation in a magnetic field. That is, as described above with reference to FIGS. 1 and 2, the patch 100 is formed of a material sheared according to applying a magnetostatic field and applying a magnetomotive field in a direction orthogonal thereto or a material with a magnetomotive field generated according to applying a magnetostatic field and applying a shearing deformation. For example, the patch 100 may be formed of nickel.

The patch 100 may be configured to have a circular ring shape having a hole 110 formed in the center thereof. That is, the patch 100 may have a ring shape.

In this case, the patch 100 and the permanent magnet 400 may be arranged in such a manner that a direction of a bipolar array of the permanent magnet 400 is to be identical to a normal line vector of a plane of the patch 100. That is, a vector component formed of the bipolar array of the permanent magnet 400 may be configured to be orthogonal to a plane formed by the patch 100 and penetrate the plane. As an example, as shown in FIG. 15, the patch 100 is arranged on a plane, the permanent magnet 400 is arranged on the patch 100, and both poles of the permanent magnet 400 may be perpendicularly arranged. The permanent magnet 400 may be located on a central portion of the patch 100.

Having the arrangement as described above, as shown in FIG. 15, the magnetostatic field generated by the permanent magnet 400 has a radial shape progressing from the center of the patch 100 to the outside in a diametrical direction.

The insulator 200 is disposed on the top surface of the patch 100. The insulator 200 may be disposed on the top surface of the patch 100 in such a way that the patch 100 is disposed below the insulator 200. Since the insulator 200 is disposed on the top surface of the patch 100, there may not be a direct contact between the coil 300, which will be described below, and the patch 100 on the top surface of the patch 100. The insulator 200 may be formed in a circular ring shape having a hole 210 in the center thereof as the patch 100, in accordance with the shape of the patch 100.

The coil 300 is wound around the patch 100 and the insulator 200 in a certain form, to which a current may be applied.

In this case, the coil 300 is wound around the patch 100 and the insulator 200 in the certain form to allow the current applied to the coil 300 to generate a magnetomotive field to the patch 100. That is, as described above, since the insulator 200 is disposed on the top surface of the patch 100, the coil 300 may be wound around an entire structure in which the patch 100 is coupled with the insulator 200.

In this case, the wound coil 300 may have a shape by which a direction of the magnetostatic field generated by the permanent magnet 400 and a direction of the magnetomotive field generated by winding the coil 300 according to applying the current to the coil 300 are orthogonal to each other.

For example, referring to FIG. 15, since a magnetostatic field K1 generated by the permanent magnet 400 has a radial shape with the center of the patch as the center, a magnetomotive field K2 generated by the coil 300 may have a circumferential direction along the patch 100 to be orthogonal to the magnetostatic field K1, and the coil 300 may have a winding form to form the magnetomotive field K2 having the shape described above. According thereto, the magnetomotive field K2 in a circumferential direction, generated by the current flown into the coil 300 may be orthogonal to the magnetostatic field K1. On the other hand, the coil 300 is wound to be equally spaced in a circumferential direction of the patch 100, thereby uniformly applying the magnetomotive K2 to the patch 100 in the circumferential direction.

Figure 16:
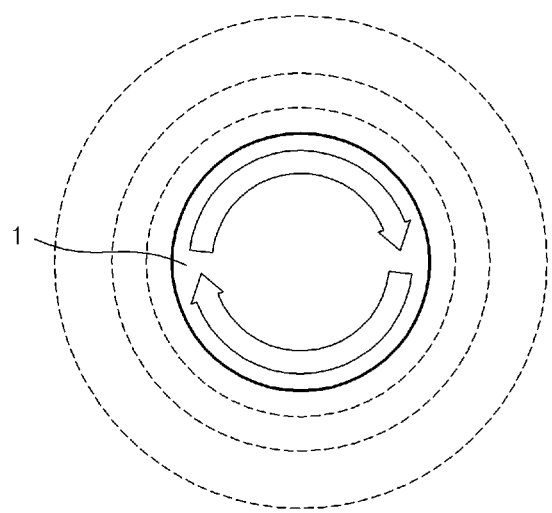
FIG. 16 is a view illustrating an omni-directional shear-horizontal wave generated by the transducer of FIG. 3.

Applying a magnetic field as described above, the theory of FIG. 1 is applied, thereby generating a shear-horizontal wave in all directions of a plane forming an area of the patch 100. That is, since the magnetostatic field generated by the permanent magnet 400 has a radial shape in all directions of the patch 100 from the center of the patch 100 and the magnetomotive field occurs in the circumferential direction of the patch 100, the two magnetic fields may be orthogonal to each other at all points of the patch 100. The orthogonality between the two magnetic fields at all positions allows shearing deformation to be formed on the entire patch 100, which may generate an omni-directional shear-horizontal wave, as shown in FIG. 16.

Additionally, when the shearing deformation is applied to the patch 100 according to the theory of FIG. 2, a magnetomotive field generating an induced current in a wire forming the coil 300 may occur.

On the other hand, a certain supporter 600 is provided to properly attach or mount the transducer 1 to a certain object, and an electric terminal 500 that may apply power toward the coil 300, into which the induced current generated by the coil 300 may be inputted.

Hereinafter, a detailed configuration of the insulator 200 will be described.

Referring to FIG. 5, the insulator 200 is formed in a circular ring shape having the hole 210 in the center thereof. The insulator 200 includes outer grooves 202 formed equally spaced in an outer circumferential portion and inner grooves 204 formed equally spaced in an inner circumferential portion, in which the outer grooves 202 and the inner grooves 204 are formed in the same number and may be arranged in positions corresponding to one another in a diametrical direction.

That is, referring to FIG. 5, the insulator 200 is formed in a ring shape having a configuration in which a plurality of grooves are formed on the outer circumferential portion and the inner circumferential portion. As described above, the plurality of outer grooves 202 formed on the outer circumferential portion and the plurality of inner grooves 204 formed on the inner circumferential portion are formed equally spaced on the outer circumferential portion and the inner circumferential portion, respectively, formed in the same number, and are arranged in locations corresponding to one another in the diametrical direction.

As an example, when there are ten outer grooves 202, there may also be 10 inner grooves 204, and an angle between the respective outer grooves 202 and an angle between the respective inner grooves 204 may be 36 degrees. On the other hand, the number of outer grooves 202 and inner grooves 204 may be random one and the angles there between may become appropriate according thereto.

Figure 10:
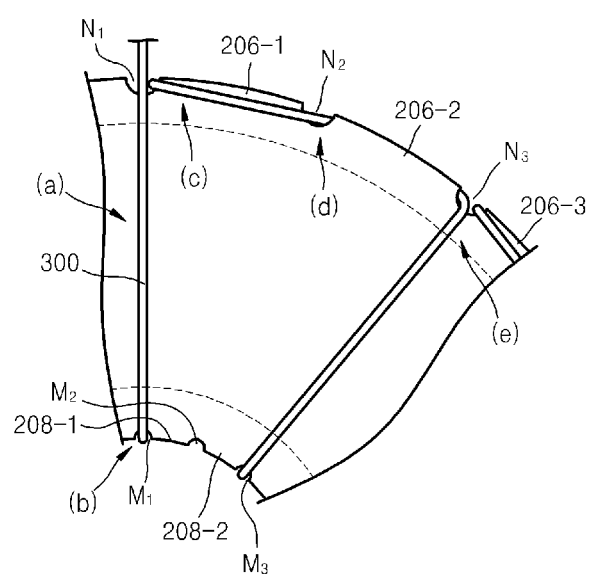
FIGS. 10 to 13 are views illustrating a method of winding coils around the patch and the insulator of the transducer of FIG. 3.

In the case of the relationship between the outer grooves 202 and the inner grooves 204, as shown in FIG. 10, when the outer groove 202 and the inner groove 204 formed in a part at which the coil 300 is initially wound are designated as a first outer groove N1 and a first inner groove M1, respectively, the first inner groove M1 and the first outer groove N1 are separated from the center at different distances but may be located at the same location in a circumferential direction. In other words, when it is assumed that there is one line segment passing through the center of the patch in the diametrical direction, the first inner groove M1 and the first outer groove N1 are located together on the one line segment, which is also applied to other outer grooves 202 and inner grooves 204.

In this case, an outer guide 206 may be formed on a part between the respective outer grooves 202, and an inner guide 208 may be formed on a part between the respective inner grooves 204. The outer guide 206 and the inner guide 208, described as follows, may allow the wire forming the coil 300 to be easily disposed and wound and additionally to be wounded in an equidistance in the circumferential direction of the patch 100 and may allow a uniform magnetomotive field to be generated.

As the outer groove 202 and the inner groove 204 are formed, the coil 300 may be easily wound around the insulator 200. That is, the coil 300 is wound to surround the patch 100 and the insulator 200 and is disposed into and supported by the outer grooves 202 and the inner grooves 204, thereby stably forming and winding the coil 300.

Also, according to a method of winding the coil 300 by using the outer grooves 202 and the inner grooves 204, the coil 300 may be wound to generate the magnetomotive field that is orthogonal to the magnetostatic field generated by the permanent magnet 400.

A radius of the hole 110 of the patch 100 may be ⅓ of the outer patch 100. That is, a half wavelength of a certain frequency shear-horizontal wave, a difference (R-r) of an outer radius and an inner radius of the patch 100, and an inner diameter 2r of the patch 100 may be identical, respectively, in which a magnitude of a signal may be measured as the largest.

Hereinafter, the method of winding the coil 300 to generate the magnetomotive field that is orthogonal to the magnetostatic field generated by the permanent magnet 400 as described above will be described.

Referring to FIG. 10, the method of winding the coil 300 may include operations of (a) transferring a wire along a top surface from the outside of the insulator 200 in a diametrical direction, (b) winding the wire by transferring the wire to a bottom surface of the patch 100 through the first inner groove $M_1$ while transferring the wire to the first outer groove $N_1$, (c) transferring the wire exposed to the top surface through the first outer groove $N_1$ to the bottom surface through a top surface of a first outer guide 206-1 and a second outer groove $N_2$, and (d) exposing the wire to the top surface through a bottom surface of a second outer guide 206-2 and a third outer groove $N_3$. The method of winding the coil 300, including the respective operations, is performed on the entire circumferences of the patch 100 and the insulator 200, thereby winding the entire patch 100 and insulator 200 and forming the coil 300. For example, as shown in FIG. 7, when the insulator 200 has 2n number of outer grooves and inner grooves, respectively, the winding method is performed n times, thereby winding the entire circumference of the patch 100 and insulator 200.

In this case, the first outer groove $N_1$ and the first inner groove $M_1$ designate an outer groove and an inner groove formed in locations at which the wire is initially wound, respectively. The first outer guide 206-1 designates a part between the first outer groove $N_1$ and the second groove $N_2$, and a first inner guide 208-1 designates a part between the first inner groove $M_1$ and the second inner groove $M_2$. This is not limited to particular outer grooves, inner grooves, outer guides, and inner guides. The description as above may be applied also to the nth (n≥1) inner groove, outer groove, outer guide, and inner guide. On the other hand, according to the above, the first outer groove $N_1$ and the first inner groove $M_1$ are located in locations corresponding to each other, which is also applied not only to outer grooves and inner grooves but also to outer guides and inner guides.

When the method of winding as described above is performed once on the entire circumference of the insulator 200, a winding form, as shown in FIG. 7, is formed. In the case of the winding form, as shown in FIG. 7, since a coil is disposed in an odd-numbered grooves and an inner grooves corresponding thereto, for convenience, winding may be designated as being performed with respect to the odd-numbered outer grooves and the corresponding inner grooves.

When winding the coil 300 according to the method as described above, since winding is performed to surround respective parts of the patch 100 in a diametrical direction instead of spirally winding to be inclined as a spring, a magnetomotive field of the patch 100 in the circumferential direction may be generated and then the magnetomotive field may be orthogonal to a radial magnetostatic field. Also, the winding as described above is allowed to be uniform over the entire patch 100 in the circumferential direction, thereby generating a uniform magnetomotive field.

On the other hand, when there are 2n−1 number of outer grooves and inner grooves, respectively, the coil 300 may be wound around all the 2n−1 number of outer grooves and inner grooves, respectively.

Figure 11:
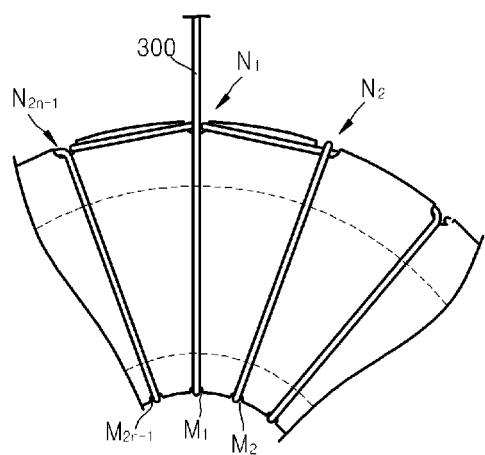

That is, as shown in FIG. 11, when the winding method is repetitively performed and the wire passes through a (2n−1)th outer groove $N_{2n-1}$ to be exposed to a top surface, the winding method is performed once more on the entire circumference, thereby winding around even-numbered outer grooves and inner grooves in the same form. In other words, as shown in FIG. 11, when respective numbers of outer grooves and inner grooves are 2n−1, the winding method is performed twice on the entire circumference, thereby winding the entire 2n−1 number of outer grooves and inner grooves, respectively.

That is, when there are 2n−1 number of outer grooves and inner grooves, respectively, the winding method as described above is performed 2× (X≥1) times with respect to the entire circumference, the wire exposed to the top surface through a $(2n-2)^{th}$ outer groove is transferred to a $(2n-2)^{th}$ inner groove, and then the wire exposed to a bottom surface through the $(2n-2)^{th}$ inner groove is transferred to the $(2n-2)^{th}$ outer groove, thereby performing a plurality of times of winding the entire circumference. In this case, a reason for performing the winding method 2× (X≥1) times is that the number of winding respective grooves may be different from one another when performing an odd number of times.

On the other hand, after winding repetitively as described above, when the $(2n-1)^{th}$ outer groove and inner groove are wound finally, the wire may be extended outward and may be connected to an electric terminal as shown in FIGS. 3 and 4.

On the other hand, when there are 2n number of outer grooves and inner grooves, respectively, all the 2n number of outer grooves and inner grooves, respectively, may be wound by a following method:

Hereinafter, referring to FIGS. 12 and 13, a method of winding a coil around 2n number of outer grooves and inner grooves, respectively, will be described. FIG. 13 is a view illustrating a bottom surface of FIG. 12.

Figure 12:
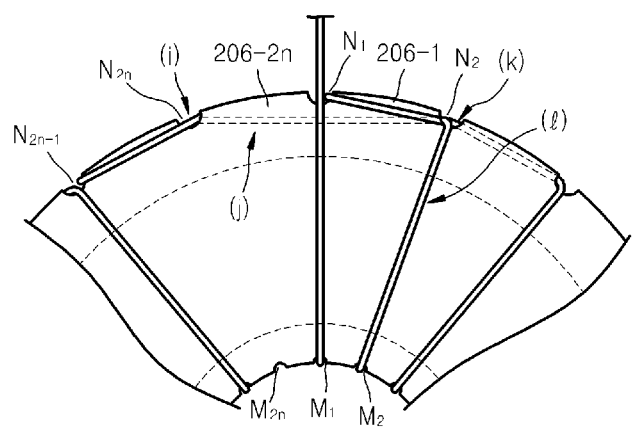
Figure 13:
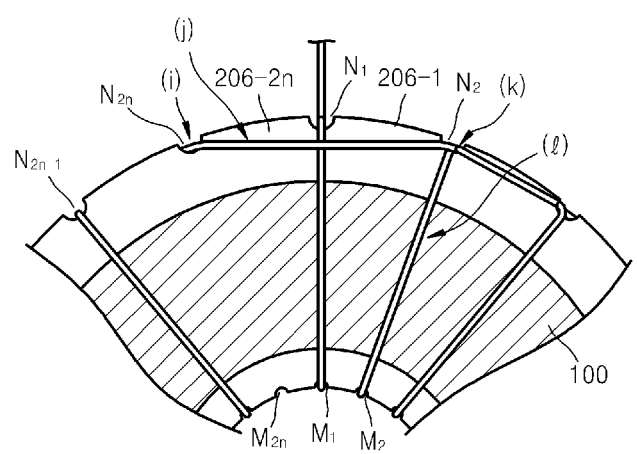

As shown in FIGS. 12 and 13, the coil-winding method according to the present embodiment includes operations of winding a coil around the entire circumference once, (i) allowing the wire to pass through a $2n^{th}$ outer groove $N_2n$ and to be exposed to a bottom surface, (j) allowing the wire to pass bottom surfaces of a $2n^{th}$ outer guide 206-2n and a first outer guide 206-1, (k) exposing the wire to a top surface through the second outer groove $N_2$, and (l) transferring the wire exposed to the top surface through the second outer groove $N_2$ to the second inner groove $M_2$, and sequentially perform the winding method described with reference to FIG. 10 on the entire circumference.

In this case, as shown in FIG. 12, in operation (j) allowing the wire to pass the bottom surfaces of the $2n^{th}$ outer guide 206-2n and the first outer guide 206-1, the wire passes without passing through the first outer groove $N_1$.

According thereto, even-numbered outer grooves and inner grooves may be identically wound and the entire circumference of the patch 100 may be wound.

FIG. 14 illustrates the transducer 1 having a form in which all outer grooves and inner grooves are wound by using the method as described above when the outer grooves and inner grooves are 2n number, respectively.

Figure 18:
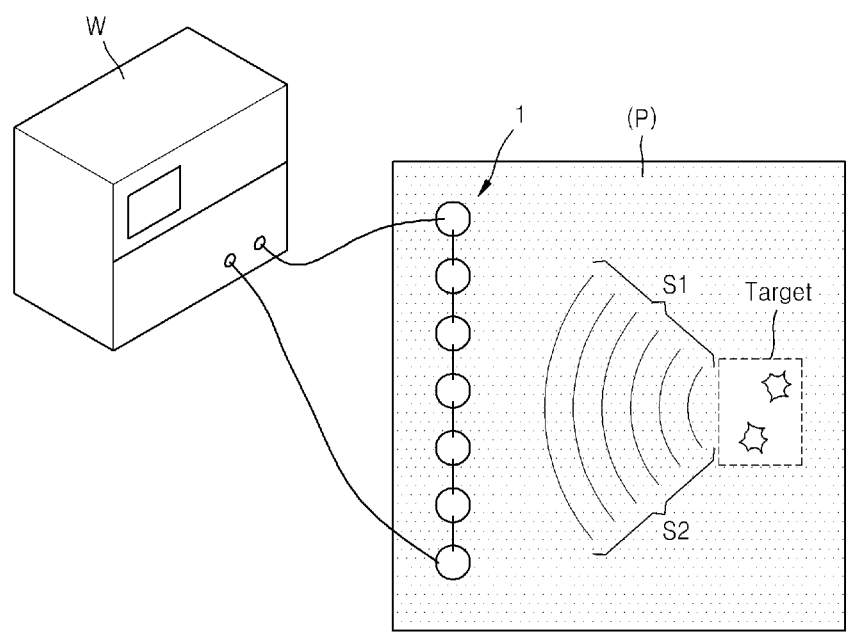
FIG. 18 is a view illustrating an inspection apparatus including transducers, according to an embodiment of the present invention.

FIG. 18 is a view illustrating an inspection apparatus using transducers 1, according to an embodiment of the present invention.

As shown in FIG. 18, the transducers 1 are arranged on a certain plate-like structure P and a shear-horizontal wave is generated toward an inspection area, thereby inspecting damage or various abnormal states of the inspection area. S1 designates a shear-horizontal wave generated by the transducer 1 and S2 designates a shear-horizontal wave reflected by the inspection area but is not limited thereto. In this case, the inspection area may be stored as images and data by a certain device W.

Hereinafter, effects of the transducer 1 will be described.

The transducer 1 has the configuration as described above, thereby generating a shear-horizontal wave in all directions.

Figure 17:
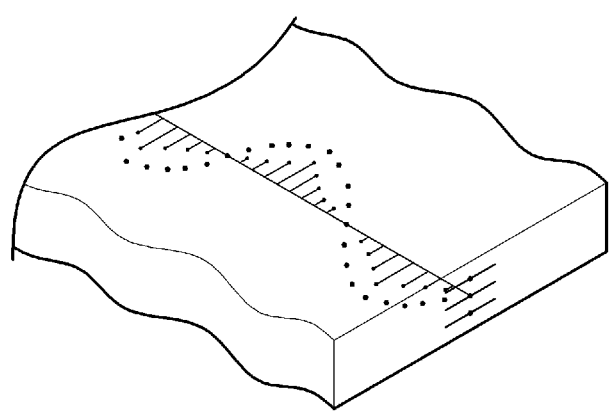
FIG. 17 is a view illustrating a waveform of the propagating shear-horizontal wave in a plate.

FIG. 16 is a view illustrating an omni-directional shear-horizontal wave generated by the transducer 1, and FIG. 17 is a view illustrating a waveform of a propagating shear-horizontal wave in a plate.

As shown in FIG. 17, in the case of the shear-horizontal wave, a motion of a particle is polarized horizontally toward a surface of a medium in such a way that only in-plane deformation exists with respect to a plane formed by directions of propagation and the motion of the particle.

The shear-horizontal wave may overcome dispersion properties according to a frequency, simultaneous existence of a symmetric mode and an anti-symmetric mode, and sensitivity to an effect caused by a surface load, which are defects of general Lamb waves. That is, it is possible to have an SH0 mode having non-dispersive properties, it is easy to use a single mode, and it is not sensitive to an effect of a surface load, thereby making up for the defects of Lamb waves.

Also, since the transducer 1 generates a shear-horizontal wave in all directions, an inspection may be easily and precisely performed and it is possible to configure a low-priced non-destructive examination apparatus having high efficiency.

Also, as described above, according to the excitation theory and the measurement theory, the transducer 1 may be used as an excitation source when applying current and may be used as a sensor when applying a shearing deformation.

Also, the coil-winding method according to the present embodiment may allow a coil to be uniformly wound around an entire circumference of a ring-shaped patch, thereby generating an even magnetomotive field in a circumferential direction and allowing the transducer 1 to generate a uniform shear-horizontal wave in all directions.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transducer comprising:
    a permanent magnet that generates a magnetostatic field;
    a patch disposed below the permanent magnet and formed of a material that deforms according to a magnetic field;
    an insulator disposed on a top surface of the patch; and
    a coil wound around the patch and the insulator in a certain form and allowing a magnetomotive field to be induced on the patch according to an applied current,
    wherein the wound coil has a form in which directions of the magnetostatic field generated by the permanent magnet and the magnetomotive field generated by winding the coil are orthogonal to each other.

2. The transducer of claim 1, wherein the patch comprises nickel.

3. The transducer of claim 1, wherein the patch is formed in a circular ring shape having a hole formed in the center thereof.

4. The transducer of claim 3, wherein the permanent magnet is disposed on a central portion of the patch in such a way that the magnetostatic field generated by the permanent magnet has a radial shape with the center of the patch as the center, and wherein the coil is wound to radially surround the patch in such a way that the magnetomotive field generated by the coil is formed in a circumferential direction along the patch.

5. The transducer of claim 4, wherein the coil is wound around the patch to be equally spaced in a circumferential direction of the patch.

6. The transducer of claim 4, wherein the hole of the patch has a radius that is ⅓ of the outer radius of the patch.

7. The transducer of claim 4, wherein the insulator is formed in a circular ring shape having a hole in the center thereof and comprises outer grooves formed equally spaced on an outer circumferential part and inner grooves formed equally spaced on an inner circumferential part, and wherein the outer grooves and the inner grooves are formed in the same number and are arranged in locations corresponding to one another in a diametrical direction.

8. The transducer of claim 7, wherein the insulator is disposed on the top surface of the patch.

9. The transducer of claim 7, wherein the coil is wound to surround the insulator while being disposed in and supported by the outer grooves and the inner grooves.

10. A coil-winding method of forming an equally-spaced coil by winding a wire around a patch type structure formed as a discus shape having a hole in the center thereof and comprising outer grooves formed equally spaced in an outer circumferential part and inner grooves formed equally spaced in an inner circumferential part, the outer grooves and the inner grooves being formed in the same number and being arranged in locations corresponding to one another in a diametrical direction, the method comprising:

transferring the wire from the outside of the patch type structure along a top surface in a diametrical direction;

winding the wire by transferring the wire to a bottom surface of the patch type structure through a first inner groove while transferring the wire to a first outer groove;

transferring the wire exposed to the top surface through the first outer groove to a bottom surface through a top surface of a first guide and a second outer groove; and exposing the wire to the top surface through a bottom surface of a second guide and a third outer groove.

11. The method of claim 10, further comprising, when forming an equally-spaced coil by winding a wire around a patch type structure having 2n (n≥1) number of outer grooves and inner grooves, respectively:

winding the coil around the entire circumference once;

allowing the coil to pass through a $2n^{th}$ outer groove and to be exposed to a bottom surface;

allowing the wire to pass bottom surfaces of a $2n^{th}$ outer guide and a first outer guide;

exposing the wire to a top surface through the second outer groove $N_2$; and transferring the wire exposed to the top surface through the second outer groove $N_2$ to a second inner groove $M_2$.

12. A transducer comprising an insulator and a patch around which a coil is wound by using a method according to claim 10, wherein the patch is formed of a magnetostrictive material, and wherein the patch is disposed below the insulator.

13. A transducer comprising an insulator and a patch around which a coil is wound by using a method according to claim 11, wherein the patch is formed of a magnetostrictive material, and wherein the patch is disposed below the insulator.

* * * * *